(12) United States Patent
Schiano et al.

(10) Patent No.: US 10,067,204 B2
(45) Date of Patent: Sep. 4, 2018

(54) METHOD AND DEVICE FOR COMPENSATION OF TEMPORAL MAGNETIC FIELD FLUCTUATIONS IN POWERED MAGNETS

(71) Applicant: The Penn State Research Foundation, University Park, PA (US)

(72) Inventors: Jeffrey L. Schiano, State College, PA (US); Brian F. Thomson, Mantua, NJ (US)

(73) Assignee: The Penn State Research Foundation, University Park, PA (US)

( * ) Notice: Subject to any disclaimer, the term of this patent is extended or adjusted under 35 U.S.C. 154(b) by 285 days.

(21) Appl. No.: 14/988,060

(22) Filed: Jan. 5, 2016

(65) Prior Publication Data

US 2016/0196910 A1      Jul. 7, 2016

Related U.S. Application Data

(60) Provisional application No. 62/099,791, filed on Jan. 5, 2015.

(51) Int. Cl.
*H01F 7/06* (2006.01)
*H01F 6/00* (2006.01)
(Continued)

(52) U.S. Cl.
CPC .................. *G01R 33/389* (2013.01)

(58) Field of Classification Search
CPC .......................... G01R 33/389; G01R 33/445
See application file for complete search history.

(56) References Cited

U.S. PATENT DOCUMENTS

| | | |
|---|---|---|
| 5,302,899 A | 4/1994 | Schett et al. |
| 7,474,976 B2 | 1/2009 | Schenkel et al. |

(Continued)

OTHER PUBLICATIONS

Estimation and Reduction of Temporal Magnetic Field Fluctuations in Powered Magnets Using Inductive and NMR Feedback Control (Peen State Electronic Theses and Dissertations for Graduate School [online]. etda.libraries.psu.edu [retrieved on Nov. 12, 2013]. Retrieved from the Internet: <URL: https://etda.libraries.psu.edu/catalog/19934>.*

*Primary Examiner* — Thienvu Tran
*Assistant Examiner* — Nicolas Bellido
(74) *Attorney, Agent, or Firm* — Dinsmore & Shohl LLP

(57) ABSTRACT

A system for reducing temporal fluctuations in a powered magnet. The system includes a magnetic field generator that generates a magnetic field with temporal fluctuations and a power supply having an AC/DC converter that delivers electric current to the magnetic field generator. A cascade compensator having an inner control loop that outputs an inner loop signal and an outer control loop that outputs an outer loop signal is included. The inner control loop has a pickup coil and an analog integrating preamplifier and the outer control loop has a magnetic resonance field estimator. The inner control loop senses fluctuations of the magnetic field over 1 Hz and the outer control loop senses fluctuations of the magnetic field from DC to 20 Hz. The cascade compensator generates a correcting magnetic field that cancels the fluctuations based on the inner loop signal and the outer loop signal.

20 Claims, 8 Drawing Sheets
(7 of 8 Drawing Sheet(s) Filed in Color)

(51) Int. Cl.
*H01F 7/02* (2006.01)
*G01R 33/389* (2006.01)

(56) References Cited

U.S. PATENT DOCUMENTS 8,598,869 B2 12/2013 Wallauer
2007/0040553 A1* 2/2007 Hajimiri ............ G01R 33/3808
324/309

* cited by examiner

METHOD AND DEVICE FOR COMPENSATION OF TEMPORAL MAGNETIC FIELD FLUCTUATIONS IN POWERED MAGNETS

RELATED APPLICATION

This application claims priority of U.S. Provisional Patent Application Ser. No. 62/099,791 filed Jan. 5, 2015, which is incorporated in its entirety herein by reference.

GOVERNMENT SPONSORSHIP

The invention was made with government support under Contract Nos. DMR0603042 and DMR1039938, awarded by The National Science Foundation. The Government has certain rights in the invention.

RELATED FIELD

The present disclosure is related to compensation of temporal magnetic field fluctuations and particularly to compensation of temporal magnetic field fluctuations in powered magnetics using a cascade compensator.

BACKGROUND

Nuclear magnetic resonance (NMR) resonance spectroscopy and magnetic resonance (MR) imaging require an external static magnetic field to polarize the magnet moment of nuclei. The quality of the static magnetic field is gauged by its strength, spatial homogeneity, and temporal stability. Low-temperature superconductors (LTS) operating in the self-persistent mode represent the state-of-the-art technology for generating high quality magnetic fields. Persistent mode magnets provide spatially homogeneous fields with small temporal field fluctuations over a large period of time via the aid of shims and a field-frequency lock (FFL). However, the maximum field strength of self-persistent magnets is limited to 23.5 Tesla by the physical properties of LTS materials. Furthermore, to maintain a superconducting state, the LTS materials must be cooled to the temperature of liquid helium.

Increasing the field strength beyond 23.5 Tesla offers unique opportunities for studying NMR phenomena by increasing the chemical shift resolution and signal-to-noise ratio (SNR), while decreasing quadrupolar line broadening in solids. Higher fields also increase the spatial resolution of MR images and permit physiologic MR studies using low-gamma nuclei that require larger field strength to maintain measurement SNR. Eliminating the need for liquid helium cooling enables the development of compact systems that will extend the use of MR systems from hospitals to physician's offices.

Powered magnets provide fields strengths substantially greater than 23.5 Tesla and some designs do not require liquid helium cooling. In contrast to persistent mode magnets, powered magnets, such as resistive or hybrid magnets, require an external power source. Resistive magnets use a normal-metal coil. Hybrid magnets may use a combination of normal metals and superconductors. For example, powered magnets that surround an inner high-temperature superconductors (HTS) coil with an outer LTS coil are currently being developed. These LTS/HTS magnets have produced field strengths up to 24 T.

Another example of powered hybrid magnets combines normal and LTS coils to produce fields significantly greater than 24 T. One such magnet produces fields up to 45 T, i.e. almost twice what is available with current LTS/HTS magnets. The resistive and LTS coils in such a magnet are connected to separate power supplies to control the operating current of each coil individually.

The National High Magnetic Field Laboratory (NHMFL) is constructing a hybrid magnet designed to produce fields up to 36 T. While the NHMFL hybrid magnet will not have as high a field as the world record 45 T hybrid magnet, the NHMFL powered magnet is designed for higher spatial field homogeneity with less temporal field fluctuations. Unlike the 45 T hybrid magnet, the resistive and LTS coils of the NHMFL magnet will be operated using the same current and thus allows the resistive and LTS coils to be connected in series using the same power supply. The series mode operation will increase the inductance from tens of mH to hundreds of mH, intrinsically reducing temporal field fluctuations. Additionally, the single power supply reduces operating cost and the 40 mm bore is appropriate for NMR probes.

In spite of the advantages of powered magnets, there are still significant challenges for performing NMR spectroscopy and MR imaging using this technology. For example, the Series-Connected Hybrid (SCH) magnet will produce fields that are less spatially homogeneous and thereby broaden the linewidth and reduce the signal-to-noise ratio (SNR) of the MR signal. Sample spinning and field shimming improve spatial field homogeneity.

Furthermore, despite the increased inductance of the SCH magnet, this magnet will be subject to temporal field fluctuations from power supply ripple and variations in cooling water temperature and flow rate. Higher frequency fluctuations due to power supply ripple broaden the MR spectra linewidth. Also, lower frequency fluctuations due to cooling water variations distort the amplitude and phase of consecutive MR signals by causing the peaks of consecutive MR spectra to shift in frequency. Field fluctuations in uncompensated powered magnets are on the order of 10 ppm. It is appreciated that both the linewidth broadening and MR spectra peak shifts adversely affect MR studies. In particular, temporal fluctuations preclude most NMR spectroscopy and MR imaging studies relying on phase-coherent averaging of consecutive magnetic resonance signals, for example, two dimensional NMR. Therefore, in order to use the SCH magnet, or other powered magnets, for MR, field fluctuations must be significantly reduced in the 0-1 kHz frequency range to 0.01 ppm or less.

Given the above, an improved system and method for compensating or reducing temporal magnetic field fluctuations in powered magnets would be desirable.

SUMMARY OF THE DISCLOSURE

Powered magnets provide substantially higher magnetic fields than persistent mode magnets, but their spatial field inhomogeneities and temporal field fluctuations are unacceptable for high resolution NMR spectroscopy and MR imaging. The present disclosure focuses on feedback control methods for reducing temporal fluctuations in powered magnets to enable high resolution NMR and MR imaging in powered magnets. Powered magnets may be used as a magnetic field generator. In a non-limiting embodiment, a magnetic coil may be used as the magnetic field generator. In another embodiment, a permanent magnet may be used as the magnetic field generator.

The MR signal spectra is characterized by its centroid, or Larmor frequency, which is always directly proportional to the strength of the static magnetic field, and linewidth, which is typically characterized by the full-width half-maximum metric. The Higher frequency field fluctuations due to power supply ripple at harmonics of 60 Hz distort the lineshape of NMR spectra, and lower frequency field fluctuations due to variations in cooling water temperature and flow rate shift the frequency of consecutive MR spectra peaks. Earlier studies have shown that inductive feedback control significantly reduces higher frequency fluctuations in powered magnets. Additionally, NMR feedback control, or field-frequency locks (FFLs), reduces lower frequency fluctuations in persistent mode magnets. These FFLs are in general not designed for powered magnets where higher frequency fluctuations are present.

In general, FFLs can be categorized into one of two groups: indirect or direct. Both use a feedback algorithm to generate a correction field that cancels temporal field fluctuations. Indirect and direct FFLs differ in the selection of the regulated variable. Indirect FFLs regulate the dispersion component of the magnetization to zero, while direct FFLs regulate the measured Larmor frequency to a desired value.

Indirect FFLs excite a MR response using a train of Radio Frequency (RF) pulses with a duty cycle of about 25%, and a pulse spacing on the order of 200 µs. The MR response observed between successive RF pulses is resolved into in-phase (absorption) and quadrature (dispersion) components using a phase-sensitive receiver. The indirect FFL has two modes of operation, sweep and lock. In a sweep mode, a correction coil is used to sweep the magnitude of the static magnetic field, and hence the Larmor frequency, until the MR signal spectra lies within the receiver bandwidth. The Fourier spectrum of the excitation sequence is a picket fence with components separated by the reciprocal of the pulse spacing, or 5 kHz. As the full-width half-maximum of the MR signal spectra in a shimmed magnetics is on the order of 1 Hz in LTS magnet, the sweep mode may need to shift the frequency of Larmor signal up to 2.5 KHz before it reappears within the receiver bandwidth. As a result, the sweep process may require several minutes, during which NMR spectroscopy experiments cannot be performed.

After a MR signal is acquired, the indirect FFL control system switches to a lock mode in the presence of field fluctuations that change rapidly with respect to a dominant time constant of MR signal dynamics governing a lock signal, without the necessity of switching to the sweep mode and a proportional-plus-integral-plus derivative algorithm adjusts the field generated by the correction coil to regulate the magnitude of the dispersion component to zero. By maintaining the dispersion component at zero, the feedback system cancels field fluctuations that would otherwise change the phase, and hence Larmor frequency of the MR response.

Successful operation of the lock mode requires that the amplitude of the dispersion signal be directly proportional to the variation in the Larmor frequency caused by temporal field fluctuations. This disclosure recognizes that this relationship only holds if the time scale of the temporal fluctuations is significantly larger than the spin-lattice relaxation time (T1) of the nuclei generating the lock signal. This assumption holds in all self-persistent magnets and many permanent magnet systems, but is violated in most powered magnets. In the latter case, where field fluctuations occur on a time scale close to, or shorter than, T1, the dispersion signal becomes a dynamic, nonlinear function of the field fluctuations. As a result, one can no longer rely on a proportional-plus-integral-control scheme for regulation where the error signal is the dispersion component. In this case, the correction field generated by the indirect FFL may no longer maintain the Larmor frequency within the receiver bandwidth, so that the system must reenter the sweep mode to relocate the MR response.

Direct FFLs use the measured Larmor frequency, which is always directly proportional to the magnetic field, to sense field fluctuations. Previous designs based on direct FFLs have not recognized the fact that the higher frequency field fluctuations found in powered magnets alias to lower frequency signals that do not allow the controller to cancel the field fluctuations, and simultaneously introduce lower frequency fluctuations. Accordingly, previously implemented FFLs will not work with powered magnets.

The present disclosure integrates a FFL design with a previous inductive feedback control design to reduce lower and higher frequency fluctuations in powered magnets. Digital sampled-data compensators are designed for the inductive feedback control loop in series with a FFL control loop, forming a cascade feedback control system. This approach was evaluated experimentally using NMR spectra peak frequencies and lineshape derived from free-induction decay (FID) measurements in the Keck powered magnet operating at 25 T.

The present disclosure uses a combination of an inductive feedback control with a direct FFL to reduce higher and lower frequency fluctuations in powered magnets. The inductive feedback control loop was placed in cascade with the direct FFL control loop, forming a cascade feedback control system. Three methods for direct estimation where investigated as a sensor for the direct FFL, and a corresponding compensator design for this FFL control loop was developed. The cascade feedback control system improved FID spectra peak frequency and absorption line-shape for measurements obtained using the Keck powered magnet.

The current configuration of the cascade feedback control system is implemented with two separate digital signal processors (DSPs) due to computational limitations. In addition, a stand-alone microprocessor system equipped with Field Programmable Gate Arrays (FPGA), which has significantly more computational capability than the current DSPs, can be used.

Implementing the cascade feedback control system in the presence of field gradients improves certain NMR experiments such as gradient enhanced spectroscopy and two dimensional NMR. Additionally, the system can be used for magnetic resonance imaging (MRI) that requires field gradients by reducing field fluctuations in the presence of such field gradients.

It is appreciated that the system and method disclosed herein can also be used such that powered or permanent magnets can be employed in relatively low power applications, for example, 1 T and less applications.

COLOR DRAWINGS

The patent or patent application file contains at least one drawing executed in color. Copies of this patent or patent application publication with color drawing(s) will be provided by the Office upon request and payment of the necessary fee.

DETAILED DESCRIPTION

Figure 1:
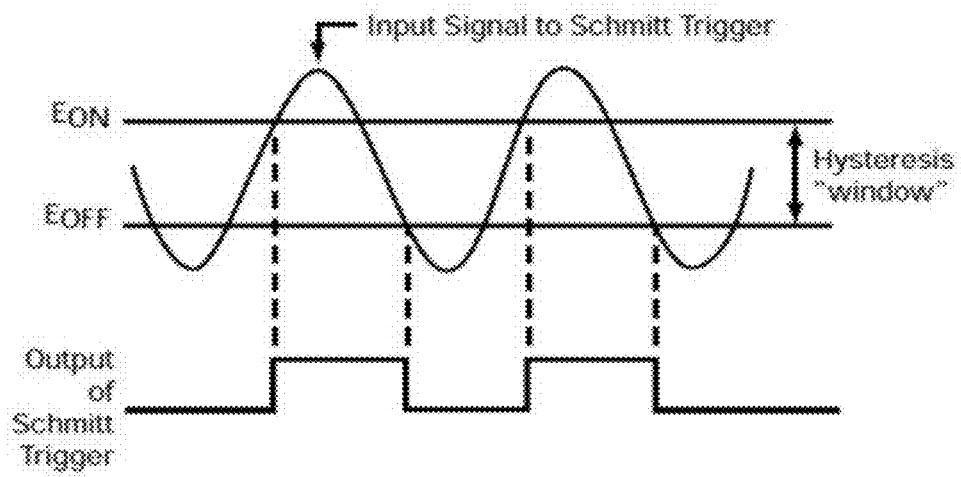
FIG. 1 is a schematic illustration of operation of a frequency counter.

A system and method for compensating or reducing temporal magnetic field fluctuations in powered magnets is provided. The system includes a magnetic coil that generates a high magnetic field and a fluctuating magnetic field, and a power supply with an AC/DC converter that delivers electric current to the magnetic coil. A cascade control circuit is also included. The cascade control circuit has an inner control loop that outputs an inner loop signal and an outer control loop that outputs an outer loop signal. Also, the inner control loop has a pickup coil and an analog integrating preamplifier, and the outer control loop has a MR field estimator that estimates the Larmor frequency of the MR response.

The inner control loop senses fluctuations of the fluctuating magnetic field over 1 Hz and the outer control loop senses fluctuations in the magnetic field from direct current (DC) to 20 Hz. In addition, the cascade control circuit generates a correcting magnetic field that cancels the fluctuating magnetic field based on the inner loop signal and the outer loop signal. The inner control loop is configured as an anti-aliasing filter for the outer control loop.

The cascade control circuit may or may not generate the correcting magnetic field based on a least squares algorithm. Also, the cascade control circuit can have an amplifier and a correction coil, the correction coil generating the correcting magnetic field.

In a preferred embodiment, the cascade control circuit affords a reduction in field fluctuations to 0.01 ppm or less. In addition, the powered magnet can be a hybrid magnet with a high-temperature superconductor coil and a low temperature superconductor coil that receives electric current from the power supply.

In addition to the above, the system has four primary objectives. The first objective determines a method for directly estimating field fluctuations from MR signal frequency. Three such methods were examined and one method was chosen as a sensor for a direct FFL. The examination also showed the known limitations of this method. The second objective combines inductive feedback control with a direct FFL design to simultaneously reduce higher and lower frequency fluctuations. The third objective demonstrates an improvement in the MR signal quality using experimental data from a powered magnet. The fourth objective allows the use of pulsed gradients required in magnetic resonance imaging and certain NMR spectroscopy techniques. The control strategy, design, and experimental results which demonstrate the second and third objectives are described below for exemplary purposes along with a comparison of the direct estimation method to previous methods.

Because the SCH magnet was not yet completed at the time of filing the present disclosure, the sensor and feedback control algorithms were developed using two magnets at the NHMFL. Algorithms implemented using a digital signal processor (DSP) were developed using a 7.1 T persistent mode magnet where temporal field fluctuations were small. Using this magnet, artificial field fluctuations were superimposed on the magnetic field, allowing design performance testing in the presence of known disturbance field fluctuations. Once the algorithms were verified in the persistent mode magnet, they were tested using a 25 T, 52 mm bore resistive powered magnet developed with the support of the Keck foundation. The sample used for this work contained 90% deuterium and 10% water with 50 mM copper sulfate doping, and in some cases manganese chloride doping.

The direct estimation methods are extensions of the frequency counter concept, where the goal is to estimate field fluctuations from changes in FID signal frequency. The experimental results are used to choose one method as the sensor for the direct FFL.

The MR field estimator uses a train of RF pulses with a duty cycle of about 10%, and a pulse spacing on the order of 25 ms. The MR response observed between successive RF pulses is resolved into in-phase (absorption) and quadrature (dispersion) components using a phase-sensitive receiver. In contrast to the indirect FFL, the MR field estimator uses an excitation sequence whose Fourier spectra consists of lines separated by 40 Hz, so that a MR response is always excited as long as the MR response remains within the bandwidth of the MR probe. By so doing, only a single sweep is required when the system is activated to set the Larmor frequency.

The common assumption for all three direct estimation methods is that the fluctuation field, $B_f$, is constant during FID signal acquisition. This assumption can be relaxed though as the methods yield an estimate of the average field value. The complex signal representation of the FID signal s(t) and corresponding phase angle φ(t) were used to develop the direct estimation methods. The expression for s(t) in response to a single RF pulse is $$s(t) = Ae^{-t/T_2*}e^{j\phi(t)}. \qquad (1)$$

where A denotes FID amplitude and j represents the imaginary unit $\sqrt{-1}$. The NMR time constant $T_2^*$ describes the decay of s(t) due to spin-spin relaxation and field inhomogeneity.

When transmitting off resonance with no field fluctuations, the FID signal frequency will consist of a single frequency component defined as the baseband frequency $\omega_b$. In this case, the phase angle in Eq. (1) can be represented as the sum of an initial phase angle $\varphi_0$ and the integral of $\omega_b$. If a constant field fluctuation $B_f$ is present during the FID acquisition, it will shift the Larmor frequency of the nuclei by $\gamma B_f$, where $\gamma$ is the gyromagnetic ratio of the sample nuclei. The frequency shift $\gamma B_f$ is denoted by $\omega_f$, and the expression for phase angle $\varphi(t)$ in this case is $$\varphi(t) = \varphi_0 + \int_0^t (\omega_b + \omega_f) d\tau = \varphi_0 + (\omega_b + \omega_f) t. \quad (2)$$

When substituting Eq. (2) into Eq. (1), the expression for s(t) becomes $$s(t) = A e^{j\varphi_0} e^{-t/T_2^*} e^{j(\omega_b t + \omega_f t)}. \quad (3)$$

The expressions in Eqs. (2) and (3) were used to develop the three methods for directly estimating $B_f$. Each method uses different techniques to estimate the frequency $\omega_f$ which can be used to derive $B_f$. The methods developed are defined here as the Fast-Fourier-Transform (FFT) method, the Level Interpolation method, and Phase Least-Squares (LS) Fit method.

The FFT method estimates $\omega_f$ from changes in the frequency at which the FFT magnitude peak occurs. Consider the Fourier Transform of Eq. (3)

$$S(\omega) = \frac{A e^{j\varphi_0}}{j(\omega - (\omega_b + \omega_f)) + 1/T_2^*}. \quad (4)$$

Observe that Eq. (4) has the largest magnitude when $\omega$ is $\omega_b + \omega_f$, and therefore the peak frequency is $\omega_b + \omega_f$. Because $\omega_b$ is fixed, estimates of $\omega_f$ can be determined from changes in the peak frequency. The Fourier Transform in Eq. (4) is computed using the FFT approximation. In this method, the smallest detectable change in frequency is limited by the duration of the observation.

The second method for estimating $\omega_f$, the Level Interpolation method, is an extension of the sensors used for previous direct FFLs. These sensors utilized a frequency counter to measure $\omega_f$ from changes in the FID signal frequency. FIG. 1 demonstrates the operation of a frequency counter.

A hysteresis window is defined with the threshold levels $E_{ON}$ and $E_{OFF}$. When the sinusoidal input signal transitions from threshold levels $E_{OFF}$ to $E_{ON}$, a Schmitt trigger detects the transition and outputs a pulse signal which changes from a low to high state. Similarly, when the signal transitions from $E_{OFF}$ to $E_{ON}$ the output of the Schmitt trigger changes from a high to low state. As the input signal is periodic, the resulting output of the Schmitt trigger is also periodic with a period equivalent to the input signal. The period of the Schmitt trigger output is inverted to obtain a measurement of the input signal frequency.

The Level Interpolation method was developed in an effort to extend the principle of a frequency counter to this work. The frequency counter assumes an analog input signal and only provides one frequency measurement for each cycle of the input signal. The direct estimation methods were to be implemented on a digital signal processor (DSP), which implies the frequency estimate must be determined from a digital, or sampled-data, signal. The Level Interpolation method is an extension of a frequency counter to a digital input signal and was designed to provide more frequency estimates per cycle than the frequency counter to improve accuracy of the estimate.

Figure 2:
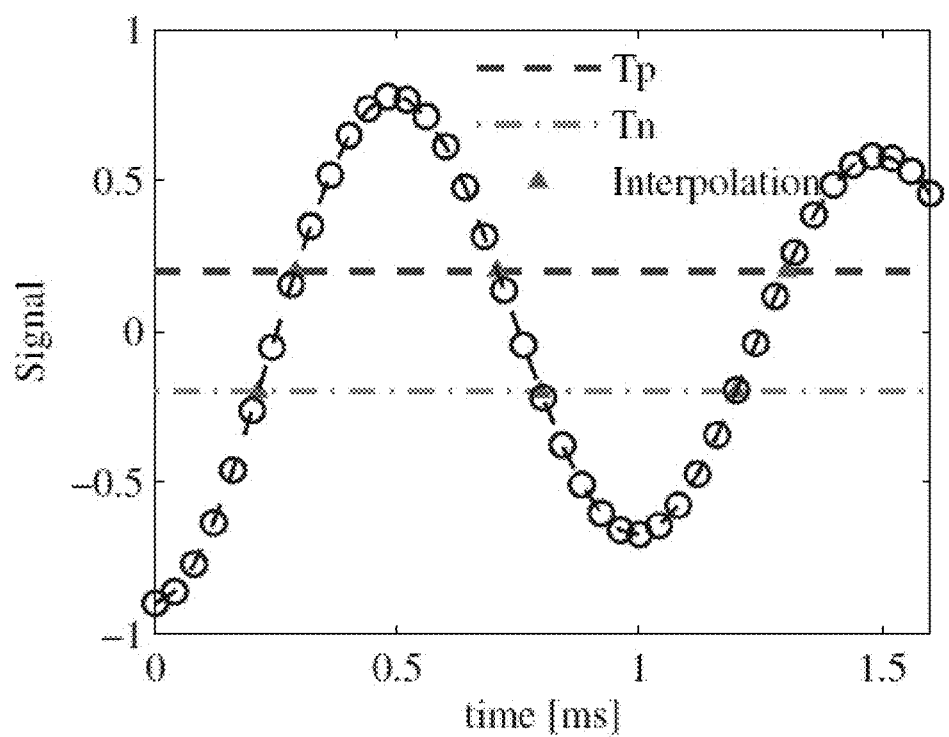
FIG. 2 is a graphical plot of level interpolation for a simulated sampled-data absorption signal.

For Level Interpolation, when the digitized FID signal transitions thru a threshold level, the nearest data point is interpolated to the threshold using a linear approximation between adjacent data points. The time between interpolated points can be used to estimate the signal period and frequency. FIG. 2 demonstrates Level Interpolation for a simulated sampled-data real component of a FID signal.

When the FID component transitions thru the threshold level Tp, the nearest data point is interpolated to Tp using a linear approximation between adjacent data points. The same is done for threshold level Tn. The open circles are sampled data points of the FID component and the solid triangles are the points from interpolating to the threshold. The time between interpolated points can be used to estimate the signal period and frequency.

The third method for estimating $\omega_f$ is Phase Least-Squares (LS) Fit, which approximates the frequency of the FID signal using a Least-Squares fit to the phase angle $\varphi(t)$. The expression for the phase angle $\varphi(t)$ in Eq. (2) is a first order polynomial with slope $\omega_b + \omega_f$. As $\omega_b$ is fixed, changes in the slope $\omega_b + \omega_f$ can be used to estimate $\omega_f$. For this method, the slope was estimated using a Least-Squares (LS) fit to $\varphi(t)$ because this algorithm reduces the effect of error due to measurement noise on the estimate. An estimate of $\omega_b + \omega_f$ could also be obtained from the derivative of Eq. (2) but this is not recommended as derivative operations amplify high frequency noise.

A brief description of the Phase LS fit algorithm is now provided. Suppose the FID signal is sampled at time $t_k$ for k equal to 0, 1, . . . , N-1, and $\varphi(k)$ is the phase angle is computed at each time $t_k$. There is some error e(k) in each phase computation because it is derived from noisy measurements of the FID signal. Each of the N phase computations satisfy $$\phi(0) = a_0 + a_1 t_0 + e(0) \quad (5)$$
$$\vdots$$
$$\phi(N-1) = a_0 + a_1 t_{N-1} + e(N-1),$$

where $\alpha_0$ and $\alpha_1$ are the true parameters $\varphi_0$ and $\omega_b + \omega_f$ respectively. The expressions in Eq. (5) can be written in matrix form as $$\Phi = F\Theta + E, \quad (6)$$

where $$\Phi = \begin{bmatrix} \phi(0) \\ \vdots \\ \phi(N-1) \end{bmatrix},$$

$$F = \begin{bmatrix} 1 & t_0 \\ \vdots & \vdots \\ 1 & t_{N-1} \end{bmatrix}$$

$$\Theta = \begin{bmatrix} a_0 \\ a_1 \end{bmatrix}, \text{ and}$$

$$E = \begin{bmatrix} e(0) \\ \vdots \\ e(N-1) \end{bmatrix}.$$

The Least-Squares fit determines estimates $\hat{\alpha}_0$, $\hat{\alpha}_1$ of the true parameters $\hat{\alpha}_0$ and $\hat{\alpha}_1$ that minimize the sum of the squared error $$J(\Theta) = \sum_{k=0}^{N-1} e^2(k) \qquad (7)$$
$$= E^T E$$
$$= (\Phi - F\Theta)^T(\Phi - F\Theta),$$

where it has been shown that the vector $\hat{\Theta}$ that minimizes $J(\hat{\Theta})$ is $$\hat{\Theta} = (F^T F)^{-1} F^T \Phi \qquad (8)$$

The expression for $\hat{\Theta}$ in Eq. (8) depends on the known matrices F, $\hat{\Theta}$, and is a column vector column vector with elements $\hat{\alpha}_n$, $\hat{\alpha}_1$. The element $\hat{\alpha}_1$ is an estimate of the frequency $\omega_b + \omega_f$ which is computed once for each FID acquired. So with $\omega_b$ fixed, an estimate of $\omega_f$ can be determined from changes in $\hat{\alpha}_1$ for different FIDs. The LS approach affords an improvement in measurement SNR as it reduces the effects of measurement noise.

Now that the three direct estimation methods have been presented, one of these methods must be chosen as a sensor for a direct FFL designed to reduce lower frequency fluctuations. As such, the FFT, Level Interpolation, and Phase LS Fit methods were evaluated by observing how well they estimate lower frequency fluctuations. The following experiment was designed to evaluate how well each direct estimation method can sense a lower frequency fluctuation.

The 7.1 T persistent mode magnet was used for this experiment because field fluctuations are relatively small in this magnet. This way a known disturbance field fluctuation can be superimposed on the magnetic field without interference from other fluctuations. The sample used for this experiment contained 90% deuterium and 10% water with 50 mM copper sulfate doping. A series of hydrogen FID signals were acquired in the presence of a disturbance field fluctuation superimposed on the magnetic field. The direct estimation method was applied to the FID data off-line to evaluate their performance.

The disturbance field fluctuation was superimposed on the magnetic field using a current amplifier and disturbance coil, and was chosen as a periodic ramp signal that shifts the FID signal frequency by 200 Hz (6.62 ppm), or 47 mG, over a period of 5 seconds. The 200 Hz amplitude was chosen as a small percentage of the 300 MHz Larmor frequency of hydrogen nuclei at 7.1 T. The 5 second period of the ramp disturbance was chosen to evaluate performance of the direct estimation methods for lower frequency field fluctuations.

The pulse sequence was chosen to have a pulse period 100 ms, and the RF pulse amplitude and width was adjusted to give largest FID SNR for this pulse period. A DSP sampled and acquired FID quadrature components in response to 100 consecutive RF pulses. Each of the 100 FID components were acquired for 2.5 ms, and the total time of the experiment was 10 seconds, which spans two periods of the ramp disturbance field.

Figure 3:
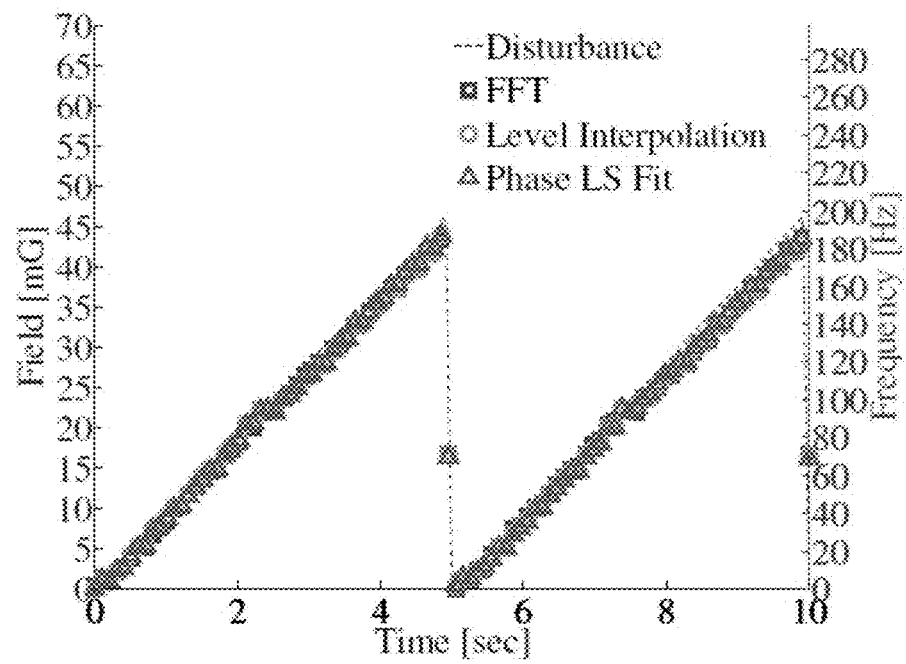
FIG. 3 is a graphical plot of a ramp disturbance field estimation for three direct estimation methods.

The direct estimation methods were applied off-line to the 100 sampled-data FID component signals. The result of each estimation method is shown in FIG. 3. The blue dashed line is the ramp disturbance field, which is represented as field in the left axis and frequency shift in the right axis. The red squares, green circles, and magenta triangles are the estimate of the disturbance field using the FFT, Level Interpolation, and Phase LS Fit methods respectively. FIG. 3 shows that the estimate matches the disturbance well for each method.

Figure 4:
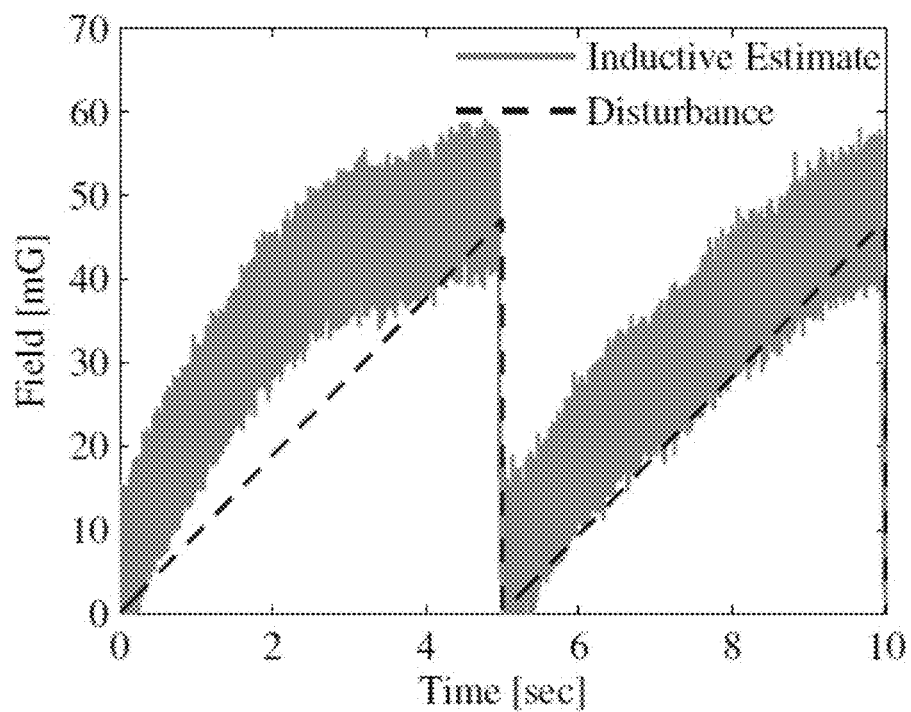
FIG. 4 is a graphical plot of an inductive measurement for a low frequency field fluctuation superimposed on the 7.1 T field of a superconducting magnet.

It is important to compare the performance of the field estimate derived from MR measurements to that derived from inductive measurements. FIG. 4 shows the estimate of the same periodic ramp disturbance field using inductive measurements. The integrating preamplifier used for these measurements is realized as a low pass filter with time constant 3 seconds so that DC offsets in the analog instrumentation will not saturate the output. This result shows the ramp disturbance field in the dotted line and the field fluctuation estimate from inductive measurements in the solid line. This is a key point that shall be emphasized strongly. It is not practical to sense low frequency field fluctuations using inductive measurements due to low frequency noise and utilization of a lowpass to approximate an integrator.

The exponential shape of the inductive estimate reveals the low pass filtering effect of the integrating preamplifier at lower frequencies. In the case of a lower frequency disturbance field, the integrating preamplifier no longer behaves as an integrator, making the inductive estimate of the field fluctuation inaccurate. This effect is not surprising because time constant is 3 seconds and the disturbance ramp occurs over 5 seconds. Additionally, low frequency 1/f noise reduces the SNR of the inductive estimate. The inductive estimate suffers from 1/f noise and low pass filtering effects, and when comparing FIGS. 3 and 4 it is apparent that these limitations are no longer present when using NMR to estimate the disturbance. This demonstrates the advantage using NMR measurements over inductive measurements for estimating lower frequency fluctuations.

While the results of FIG. 3 indicate that each estimation method can sense the ramp disturbance field, it is difficult to use these results to determine which method is performing the best. The methods can be quantitatively compared by considering metrics derived from the field estimation error $$B_e(n) = B_f(n) - \hat{B}_f(n), \qquad (9)$$

where $B_f(n)$ is the disturbance field during acquisition of the $n^{th}$ FID and $\hat{B}_f(n)$ is the estimated disturbance field from measurement of the $n^{th}$ FID. The value of $B_e(n)$ was used to compute two error metrics for each of the three estimation methods. The first error metric is the sum of the squared error and the second is the maximum value of the error. Table 1 shows these error metrics for each estimation method. The first column shows the estimation methods, the second and third column show the sum of the squared error and maximum error metrics for each method. Both error metrics are computed for n from 1 to 100 because 100 FIDs where acquired, and thus 100 field estimates are obtained for each method.

TABLE 1

Field error metrics for direct estimation methods.

| Estimation Method | $\Sigma_{n=1}^{100} B_e^2(n)$ [mG] | $\max_n B_e(n)$ [mG] |
| --- | --- | --- |
| FFT | 961 | 3.27 |
| Level Interpolation | 996 | 3.54 |
| Phase LS Fit | 907 | 3.07 |

When comparing the error metrics from Table 1, it is evident that the Phase LS Fit method has the best performance when estimating this particular ramp disturbance field. The sum of the squared error and maximum error metrics are smallest when using this estimation method. The FFT method has the second smallest error metrics, and so this method performs better than Level Interpolation for this experiment.

The results from Table 1 does not mean that the Phase LS Fit method is the best choice for all applications. For example, if the reference sample contains multiple Larmor frequencies that are close together, then the FFT method may be more useful. This method will choose the Larmor frequency with best SNR to use when estimating fluctuations. The Level Interpolation method may be more useful for FID signals with poor SNR in the acquisition window. In this case, the levels could be tuned so that estimation is performed using only the data with a good SNR. The FFT method may also be more useful for applications where the constant field assumption is not as valid. In this case, the time varying field during FID acquisition will broaden the linewidth, but the FFT peak frequency will be approximately the same.

The Phase LS Fit method was chosen for now as the sensor for the direct FFL because it showed the smallest error metrics for the ramp disturbance field when compared to the FFT and Level Interpolation methods. The Phase LS fit will now be referred to as the MR field estimator, which will be used as a sensor for the direct FFL.

The first MR field estimator limitation discussed is estimator accuracy as a function of FID SNR. The complex signal representation of the FID signal in Eq. (3) was used to simulate sampled-data FIDs and the NMR estimator was applied to these signals. The amplitude, A, was chosen as 1 Volt, which is a typical value measured in experiment. The baseband frequency $\omega_b/2\pi$ was chosen as 1 kHz because this is the desired frequency of the reference deuterium FID signals. The time constant $T_2^*$ was chosen as 22.4 ms because this was measured for the reference deuterium sample on the 7.1 T persistent mode magnet. The shift in FID frequency, $\gamma B_f$ or $\omega_f/2\pi$ was chosen as 100 Hz, which is a fraction of the baseband frequency. The acquisition time and sampling frequency of the FID were chosen as 2.5 ms and 10 kHz, which are the values used for demonstrating the MR field estimator.

The FID SNR was varied by adding white Gaussian noise with zero mean and variance $\lambda_0$ was added to the FID signals. The noise was filtered by a 4 pole butterworth filter with cutoff frequency 5 kHz, which is the Nyquist frequency for the 10 kHz FID sampling frequency. The SNR of the FID signal is defined here as the ratio of FID signal amplitude to noise variance $\lambda_0$. The FID SNR was measured to be approximately 320 V/V for FID signals acquired using a 7.1 T persistent mode magnet. Therefore the FID SNR was varied from 1 to 320 V/V, which corresponds to noise variances from 1 to 0.003, to observe the effects of FID SNR on the NMR estimator.

Figure 5:
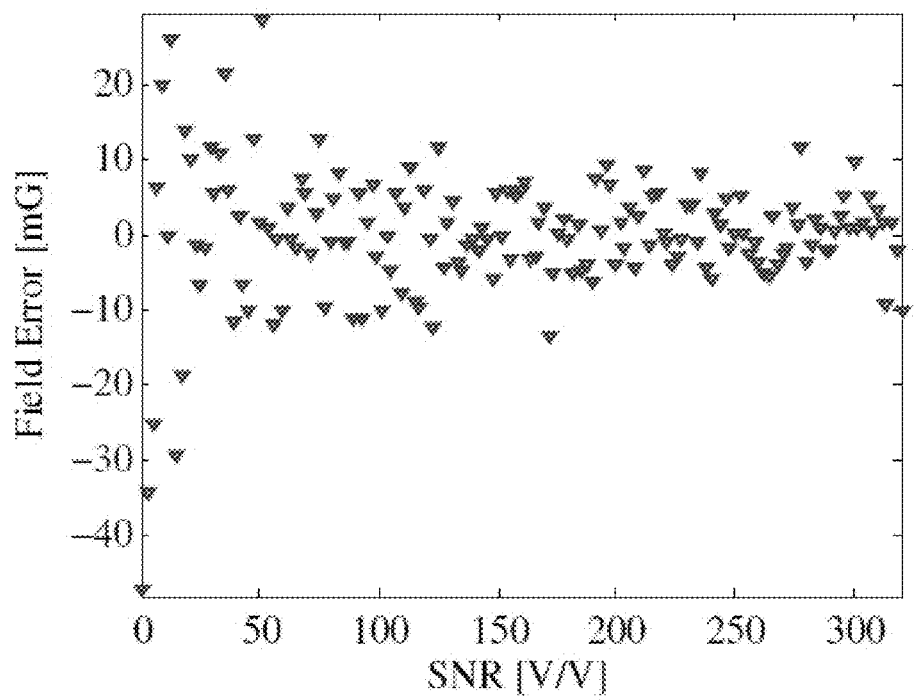
FIG. 5 is a graphical plot of a simulated estimation error for varying FID signal SNR.

The results in FIG. 5 show simulated estimation error in mG as a function of FID SNR. The vertical axis is estimation error of $B_f$ in mG and the horizontal axis is SNR in V/V. When the SNR is below 10 V/V, the estimation error can be more than 40 mG. As the SNR increases, the estimation error is reduced. When the SNR is greater than 150 V/V, the estimation error is within 10 mG. The results of FIG. 5 indicate that it is preferred to have an FID signal amplitude that is at least 150 times larger than the noise variance. When this is the case, the smallest fluctuation field the estimator can sense is 10 mG, which is equivalent to a 6.5 Hz deuterium FID frequency shift.

The second NMR estimation limitation is aliasing of field fluctuation estimates. The NMR estimator provides one estimate of the field fluctuations for every FID acquired, which occurs once per pulse period defined as $T_s$ seconds. This implies that the NMR estimator can be viewed as effectively sampling the field fluctuations at a period $T_s$, or sampling frequency $1/T_s$, which is denoted as $F_s$. Therefore any field fluctuations with frequencies above the Nyquist frequency Fs/2 will alias, causing the NMR estimator to predict field fluctuations that are not actually present.

The following experiment was designed to demonstrate aliasing of field fluctuations with frequencies above the Nyquist frequency of the MR field estimator. Using a current amplifier and disturbance coil, a sinusoidal disturbance field with amplitude 2 Gauss and frequency 39 Hz was superimposed on the Keck powered magnet operating at 25 Tesla. The sample used for this experiment contained 90% deuterium and 10% water with 50 mM copper sulfate doping. The MR field estimator was implemented in real-time using sampled-data measurements of FIDs from deuterium nuclei. The sinusoidal disturbance field and MR field estimator output, which represents an estimate of field fluctuations, were simultaneously observed.

Figure 6:
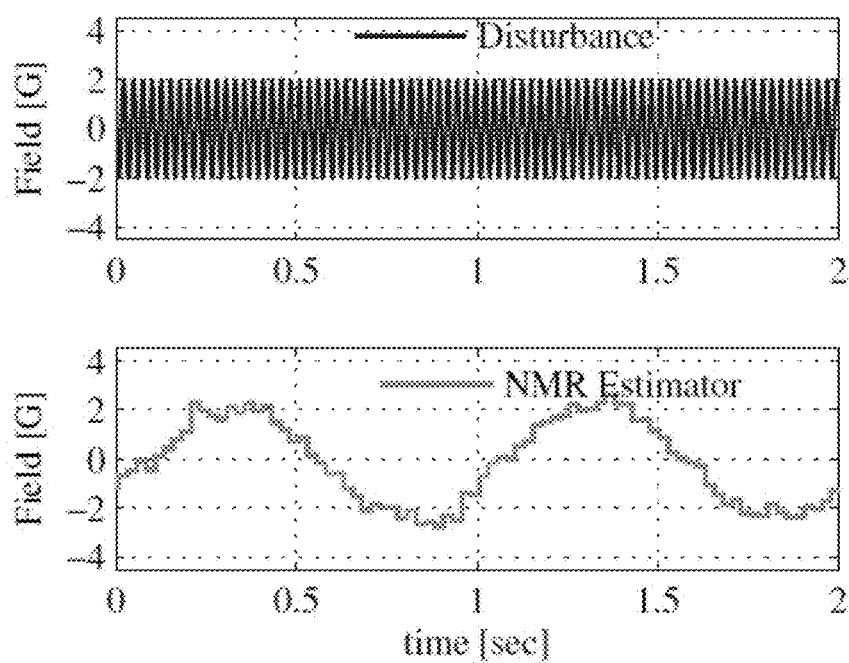
FIG. 6 is a graphical plot of an aliasing demonstration on a Keck powered magnet operating at 25 T.

The results of this experiment is shown in FIG. 6. For both subplots, the vertical axis is field in Gauss and the horizontal axis is time in seconds. The disturbance field and MR field estimator output are shown in the upper and lower subplots respectively. The disturbance field and MR field estimator output do not match for this experiment because of aliasing. For the real-time pulse sequence, the sample period $T_s$ of the NMR estimator is 25 ms, or alternatively the sampling frequency $F_s$ is 40 Hz. Any field fluctuation with a frequency above $F_s/2$ or 20 Hz will alias. The disturbance frequency was chosen to be 39 Hz, which will alias to a 1 Hz sinusoid when $F_s$ is 40 Hz. The disturbance amplitude was chosen as 2 Gauss, which is significantly larger than 0.16 Gauss rms field measured at 60 Hz on the Keck magnet. The 2 Gauss, 1 Hz aliased component in the MR field estimator output is shown in the bottom subplot of FIG. 6.

The aliasing demonstrated in FIG. 6 will be an issue for the Keck magnet because its field fluctuation spectra has significant amplitudes at 60 Hz harmonics. When Fs is 40 Hz, the 60 Hz component aliases to 20 Hz and the 120 Hz component aliases to 0 Hz. This means the components at 60 and 120 Hz will appear to the NMR estimator as 20 and 0 Hz field fluctuations. Any compensator design will try to reject these frequency components, which are not a true representation of the field fluctuations at these frequencies.

The solution to aliasing in most cases is to use an analog low pass filter with a cutoff frequency equivalent to the Nyquist frequency, which attenuates frequency components of the analog signal above the Nyquist frequency. Then when the signal is sampled, there are no higher frequency components that can alias. However, in the case of the NMR estimator, the goal is to estimate field fluctuations that are proportional to frequency shifts of the analog FID quadrature signals. Even if the frequency shifts or field fluctuations were measured with an analog device, they would need to be low pass filtered with a cutoff frequency equivalent to 20 Hz before sampling them for feedback control. If these signals were low pass filtered at the Nyquist frequency 20 Hz of the NMR estimator, then at most a 20 Hz shift in FID frequency can be estimated. For deuterium nuclei, 20 Hz frequency shift is equivalent to a 31 mG fluctuation, which is very small compared to the 4 G field fluctuations observed in experiment.

A different approach was necessary to provide anti-aliasing for the NMR estimator. An inductive feedback control design will be shown below which significantly reduces higher frequency fluctuations, thus providing anti-aliasing for the NMR estimator. This anti-aliasing will be demonstrated by applying the same 2 G, 39 Hz disturbance field from FIG. 6 while inductive feedback control is engaged.

In addition to MR field estimator limitations, there are also several tradeoffs considered when choosing parameters of the MR estimator. The first tradeoff is the choice of FID signal acquisition time $T_{acq}$ and sample period $T_b$. For the MR field estimator, it can be shown that if the elements of the error vector are modeled as independent random variables with zero mean and fixed variance, then variance of the estimate is reduced as the number of FID points acquired, N, gets large. Also recall that the MR field estimator assumes the field seen by the nuclei is approximately constant during acquisition of the FID. The time interval $T_{acq}$ must be chosen so the constant $B_f$ assumption is valid. Also the time intervals $T_b$ and $T_{acq}$ must be chosen so N is large enough for accurate estimation. It may be possible to configure $T_{acq}$ and $T_b$ to improve the estimator accuracy.

The second MR field estimator tradeoff is the choice of pulse period $T_s$, which presents a tradeoff between the FID SNR and MR field estimator sampling time. If $T_s$ is chosen large with respect to the spin-lattice lattice relaxation time, then the magnetization relaxes to thermal equilibrium in between pulses and the SNR of the FID is maximized. However, because the NMR estimator can be viewed as effectively sampling the fluctuations every $T_s$ seconds, a larger $T_s$ will increase the sampling time of the NMR estimator. This will reduce the Nyquist bandwidth of the NMR estimator. Increasing $T_s$ improves FID signal SNR but limits the NMR estimator sampling time of the fluctuations. The pulse period $T_s$ was chosen as 25 ms because it was observed experimentally that this gave give good compromise between FID SNR and MR field estimator sampling time.

Also, if $T_s$ is small compared to $T_2^*$ then stimulated echoes may interfere with the reference deuterium FIDs for the NMR estimator. This will corrupt the NMR estimator accuracy. For the experimental results shown in present disclosure, the sample was doped to reduce $T_2^*$ and avoid stimulated echoes in the reference deuterium FIDs.

Two performance metrics are used in present disclosure to evaluate the feedback control system. Recall that lower frequency fluctuations shift the frequency of consecutive FIDs while higher frequency fluctuations distort the FID spectra lineshape. Therefore the peak frequencies and lineshape of consecutive FID spectra were chosen as performance metrics. These metrics are used to define control objectives as they demonstrate the feedback control system's ability to improve NMR spectroscopy experiments by reducing lower and higher frequency fluctuations.

Three control objectives guide the feedback control system design. The first control objective is to have a feedback control system which is closed-loop stable. If the system is dynamically unstable, the ensuing parasitic oscillations add to the undesirable effects of the field fluctuations. The second control objective is to regulate FID peak frequencies around a fixed value to demonstrate reduction in lower frequency fluctuations. This can be achieved with a FFL because these are suitable for reducing lower frequency fluctuations. The third control objective is to improve FID spectra lineshape to demonstrate reduction in higher frequency fluctuations. This can be achieved with inductive feedback control as this is suitable for reducing higher frequency fluctuations.

Figure 7:
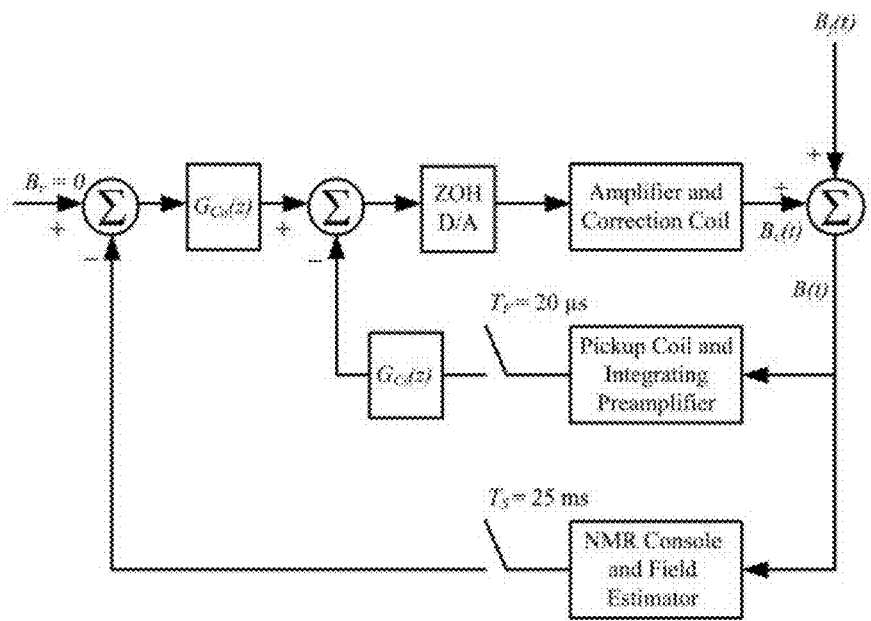
FIG. 7 is an illustration of a block diagram of a cascade feedback control strategy for reducing lower and higher frequency field fluctuation estimates according to an embodiment of the present disclosure.

FIG. 7 shows a block diagram which illustrates the proposed control topology for achieving the control objectives. There are two inputs to the control system. The reference input $B_r$ specifies the desired magnetic field with respect to the Larmor frequency and is specified by the user. In most cases the value of $B_r$ is set to zero, indicating that the desired field strength of the magnet is set to the Larmor frequency of the nuclei of interest. The second input $B_f(t)$ represents the undesirable field fluctuations caused by the power supply and magnet cooling systems. The output of the control system is the temporal field fluctuations B(t) in the magnet, and represents the superposition of a correction field $B_c(t)$ generated by the control system and the exogenous field fluctuations $B_f(t)$. The inner compensator transfer function $G_{Ci}(z)$ and outer compensator transfer function $G_{Co}(z)$ are designed to minimize the root-mean-square amplitude of the net temporal field fluctuations B(t) caused by the exogenous field fluctuations $B_f(t)$, while simultaneously regulating the value of B(t) to desired reference value $B_r$.

Still referring to FIG. 7, a multi-loop multi-rate feedback control system is shown as it is the combination of an inner loop and outer loop, each with different sampling rates. The inner loop is the inductive feedback control system, and is comprised of a current amplifier and correction coil, pickup coil and integrating preamplifier, and a digital sampled-data feedback compensator $G_{Ci}(z)$. The outer loop is the direct FFL control loop, which comprises an amplifier and correction coil, NMR console and field estimator, and a digital sampled-data feedback compensator $G_{Co}(z)$. The zero order hold digital to analog converter (ZOH D/A) is used to convert the digital output of the compensators to an analog signal for the amplifier and correction coil. The inner loop in placed in series, or cascade with the outer loop; hence, this topology is defined as a cascade feedback control system.

The inner loop sensor is the pickup coil and integrating preamplifer, which provides inductive measurements for estimating higher frequency fluctuations $B_{High}$. The analog signal at the integrating preamplifier output is sampled at a fast sampling period $T_F$ in order to observe these fluctuations. The inner loop sampled-data compensator $G_{Ci}(z)$ is designed to reduce $B_{High}$. The sample period $T_F$ was chosen as the maximum 20 µs sampling period of the DSP used to implement $G_{Ci}(z)$.

The outer loop sensor is the NMR console and field estimator, which uses the NMR estimator to estimate lower frequency fluctuations. A NMR console with pulse period $T_s$ generates analog quadrature components of the FID signals. The NMR estimator directly estimates lower frequency fluctuations $B_{Low}$ using sampled-data measurements of these signals with sampling period 100 µs. The estimate $B_{Low}$ is updated every $T_s$ seconds, and the outer loop sampled-data compensator $G_{Co}(z)$ is designed to reduce lower frequency fluctuations $B_{Low}$. The compensator sample period is equivalent to the pulse period $T_s$, which was chosen as 25 ms and is an integer multiple of the 20 µs chosen for $T_F$.

The compensator designs are determined using analog approximations to the sampled-data compensators. Increasing compensator gain maps to reducing fluctuations thus each compensator is designed to have large gain at frequencies where fluctuation reduction is desired. The stability and reduction of field fluctuations for the cascade feedback control system using these compensator designs is evaluated using computer simulations.

The inner loop sensor estimates fluctuations well for frequencies above 1 Hz, and so the inner loop compensator was designed to reduce fluctuations above 1 Hz. This compensator topology was described as the phase-lead-lag internal model principle (PLL-IMP). The IMP components are designed to selectively suppress fluctuations from 60 Hz harmonics of the power supply ripple. The PLL component shapes the frequency response to make the closed loop system stable and has small gain at low frequencies so that a DC offset will not saturate the equipment. The PLL-IMP design had to be modified for the inner loop compensator of the cascade feedback control system so that it could be combined with the direct FFL.

The new PLL-IMP design for the inner loop compensator was determined by modifying its poles and zeros to shape the frequency response of the compensator. The previous design used phase-lead and phase-lag components each with a single pole and zero, yielding a 20 dB per decade change in compensator gain in the frequencies between the pole and zero. If instead the phase-lead and phase-lag components are modified to have two poles and zeros each, then a 40 dB per decade change in compensator gain will be achieved. The extra pole-zero pair will improve the compensator gain by 20 dB in the frequencies between the poles and zeros, which improves field fluctuation reduction.

The PLL component was modified to have a 40 dB gain by 1 Hz and small gain by 2000 Hz. For the phase-lead component, if there are two poles and zeros placed at 0.1 Hz and 1 Hz respectively, then the compensator gain changes from 0 dB to 40 dB between 0.1 Hz and 1 Hz. The phase-lag component was modified to have a 40 dB gain up to 200 Hz, one decade below 2000 Hz, and reduce the gain at 40 dB per decade so that it is small at 2000 Hz. The resulting PLL component of this compensator is $$G_{PLL}(s) = G_{Lead}(s)G_{Lag}(s) \tag{10}$$

$$= \left(\frac{\frac{s}{2\pi 0.1}+1}{\frac{s}{2\pi 1}+1}\right)^2 \left(\frac{\frac{s}{2\pi 2000}+1}{\frac{s}{2\pi 200}+1}\right)^2, \tag{11}$$

which is a second order phase-lead component in cascade with a second order phase-lag component.

The IMP component was modified to decrease the magnitude and bandwidth of the compensator at the IMP frequencies. This component provides large gain at 60, 120, 180 and 720 Hz frequency components while keeping the same gain at other frequencies. The general form of the IMP component is $$G_{IMP}(s) = \prod_{n=1,2,3,12} \frac{\beta_n^2 + (n\omega_0)^2(s+\alpha_n)^2 + (n\omega_n)^2}{\alpha_n^2 + (n\omega_0)^2(s+\beta_n)^2 + (n\omega_n)^2}, \tag{12}$$

where $\omega_0 = 2\pi 60$ rad/sec. The parameters $\alpha_n$ and $\beta_n$ determine the gain at the frequencies $n\omega_0$ as well as the bandwidth of the peaks. The original choices for $\alpha_n$ and $\beta_n$ where 100 and 0.1 which showed a large closed-loop transient response to field fluctuations at the frequencies $n\omega_0$. In an effort to reduce the transient response, the gain at the IMP components was reduced by reducing $\alpha_n$. The resulting choices for $\alpha_n$ and $\beta_n$ were 5 and 0.1 respectively.

The overall inner loop compensator $G_{Ci}(s)$ is the cascade combination of the PLL and IMP components $$G_{Ci}(s) = KG_{PLL}(s)G_{IMP}(s), \tag{13}$$

where the controller gain K was chosen as 3 to give a good compromise between stability and fluctuation reduction. The digital sampled-data inner loop compensator $G_{Ci}(z)$ is the zero-order hold equivalent of the analog compensator in Eq. (13).

In contrast to the inner loop, the outer loop sensor estimates fluctuations well for frequencies below 1 Hz, and so the outer loop compensator was designed to reduce lower frequency fluctuations below 1 Hz. In order to reduce lower frequency fluctuations while maintaining higher frequency fluctuation reduction of the inner loop, the outer loop must provide high gain at lower frequencies and low gain for frequencies above 1 Hz. Thus a phase-lag compensator was chosen for the outer loop because this compensator can provide large gain at lower frequencies and less gain by 1 Hz where appreciable inner loop gain begins. The chosen phase-lag compensator design is $$G_{PL}(s) = 1000\left(\frac{\frac{s}{2\pi 0.5}+1}{\frac{s}{2\pi 0.05}+1}\right)\left(\frac{\frac{s}{2\pi 10}+1}{\frac{s}{2\pi 1}+1}\right), \tag{14}$$

which has a DC gain of 60 dB, a pole zero pair at 0.05 Hz and 0.5 Hz, and a pole zero pair at 1 Hz and 10 Hz. A compensator with this structure will have 60 dB gain from 0 Hz until the pole at 0.05 Hz, then the gain decreases to 40 dB by the zero at 0.5 Hz. From 0.5 Hz to 1 Hz, the gain is fixed at 40 dB to match the gain at this frequency from the inner loop. The gain decreases to 20 dB from 1 Hz to 10 Hz to reduce the outer loop compensator gain for frequencies above 1 Hz.

Observe from FIG. 7 that the outer loop compensator output, or correction signal, is the reference input to the inner loop. Therefore changes in the outer loop correction signal induce a transient response from the inner loop at the output B(t). For the phase lag compensator in Eq. (14), the outer loop correction signal had large transient changes in response to field fluctuations, inducing a large transient response from the inner loop at the output B(t). In order to dampen these large transient changes in the correction field, an approximation to a derivative transfer function was added in parallel to the phase-lag compensator. The approximate derivative transfer is $$G_D(s) = 10\frac{s}{s+1}, \tag{15}$$

Further reductions in low field fluctuations are possible through redesign of $G_D(s)$. The digital sampled-data compensator $G_{Co}(z)$ is the zero-order hold discrete-time equivalent of the parallel combination of Eqs. (14) and (15).

A computer simulation evaluated the stability and reduction in field fluctuations provided by the cascade feedback control system. Models for the pickup coil and integrating preamplifier as well as the correction coil and current amplifier were derived from experimental data. Additionally, the NMR console and estimator can be modeled as a integer delay 1/z. These models along with the compensator designs were used to simulate the time domain response of the cascade feedback control system in FIG. 7.

The gain margin describes the degree of stability for a feedback control design. This metric defines how much the controller gain can be increased before the system is dynamically unstable. The gain margin for the cascade control system was determined by simulating the field output B(t) in response to a unit step change in $B_f(t)$ for a series of outer loop compensator gains. When the outer loop gain is equivalent to the gain margin, the closed-loop system becomes unstable, and the output B(t) will increase without bound. The gain margin was found to be 14 dB, implying that the outer loop gain could be increased by 14 dB while remaining stable.

The field fluctuation reduction is quantified by the magnitude response of $B/B_f$, which is defined as the magnitude of the ratio BIB/as a function of frequency. As the magnitude response of $B/B_f$ gets small, field fluctuations are reduced, allowing the control designer to quantify field fluctuation suppression for a range of frequencies. The magnitude response of $B/B_f$ for the cascade control system was determined by simulating the field output B(t) in response to sinusoidal $B_f(t)$. The rms value of $B_f(t)$ and B(t) were computed, and the ratio of these rms values represent an estimate of $B/B_f$ at the sinusoidal frequency. This was repeated for multiple sinusoidal frequencies to obtain the magnitude response of $B/B_f$.

Figure 8:
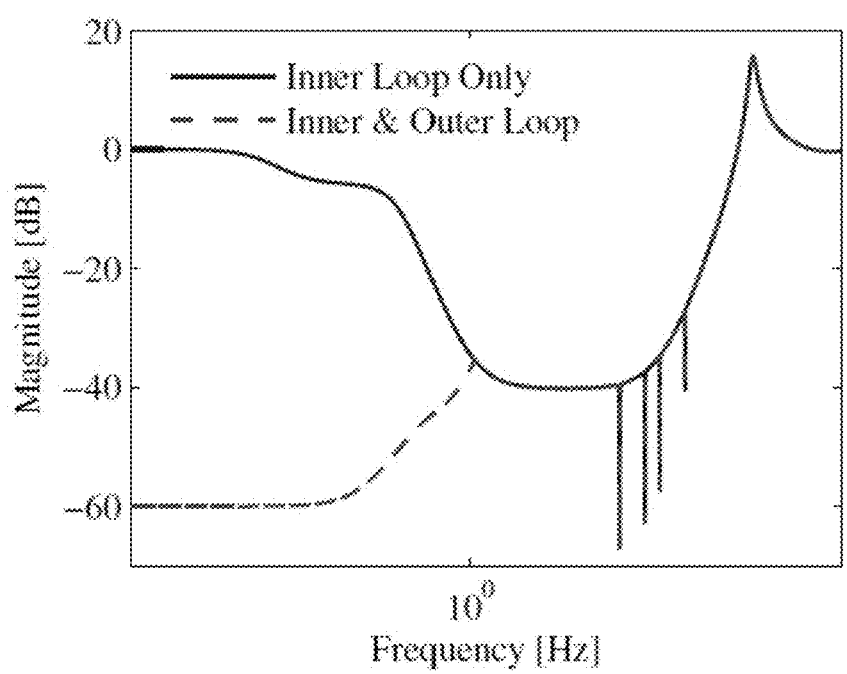
FIG. 8 is a graphical plot of a simulated magnitude response of $B/B_f$ for the cases of inner loop compensation only and inner loop plus outer loop compensation.

FIG. 8 shows the magnitude response of $B/B_f$ for two cases of compensation. The vertical axis shows the magnitude of $B/B_f$ in dB and the horizontal axis shows frequency in Hz. It is desirable for the $B/B_f$ magnitude to be as close to zero as possible, or equivalently have a more negative number in dB. The case with inner loop compensation only is indicated by the solid line and the case with inner and outer loop compensation is indicated by the dotted line. When only inner loop compensation is engaged, the $B/B_f$ magnitude is not very small for frequencies below 1 Hz because the compensator gain is small at these frequencies. The $B/B_f$ magnitude is less than −34 dB between 1 Hz and 200 Hz, and is significantly smaller at the IMP frequencies due to the large compensator gain at these frequencies. The $B/B_f$ magnitude is approximately −67 dB at 60 Hz, −62 dB at 120 Hz, −57 dB at 180 Hz, and −40 dB at 720 Hz.

In comparison to the case with inner loop only, outer loop compensation provides large gain below 0.05 Hz, and as much as 60 dB improvement in $B/B_f$ magnitude for these lower frequencies. The outer loop compensator gain reduces between 0.1 Hz and 1 Hz, which results in a $B/B_f$ magnitude change from −55 dB to −32 dB. At 1 Hz, the $B/B_f$ magnitude is approximately the same for both cases of compensation. Therefore, the field fluctuation reduction below 1 Hz accomplished by the outer loop compensator does not affect the ability of the inner loop to reduce field fluctuations above 1 Hz.

MR field estimator aliasing can be mitigated by inductive feedback control of the inner loop. Additionally, there are performance metrics derived from NMR data which specify the control objectives of the cascade feedback control system. The following validates the anti-aliasing provided by the inner loop, and derives the NMR performance metrics to determine if the control objectives are met. These performance metrics demonstrate improvement in NMR spectroscopy afforded by the cascade feedback control system.

Field fluctuations with frequency components above 20 Hz alias into the NMR estimator bandwidth. The inner loop reduces fluctuations above 20 Hz, and so it is reasonable to expect that this feedback loop provides NMR estimator anti-aliasing. In order to test this hypothesis, the same aliasing experiment from above was performed using inner loop compensation.

Figure 9:
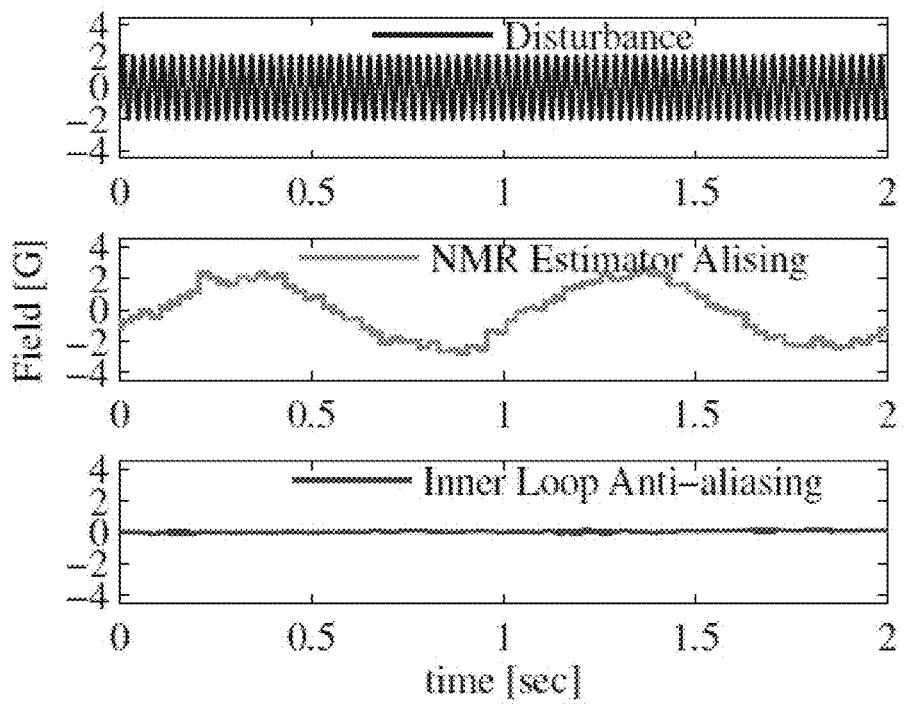
FIG. 9 is a graphical plot showing anti-aliasing using inner loop compensation on a Keck powered magnet operating at 25 T.

FIG. 9 demonstrates anti-aliasing provided by inner loop compensation in the Keck powered magnet. A sinusoidal disturbance field with frequency 39 Hz and amplitude 2 Gauss was superimposed on the Keck powered magnet operating at 25 Tesla. The MR field estimator output was simultaneously observed in the presence of the disturbance field for the cases on no compensation and inner loop compensation. The disturbance field is shown in the upper subplot, and the NMR field estimator output without compensation and with compensation are shown in the middle and lower subplots respectively.

When there is no inner loop compensation, the 39 Hz disturbance field aliases to a 1 Hz frequency component as shown above. Conversely, when the inner loop is engaged the 39 Hz disturbance field is attenuated and the 1 Hz aliased component is removed. The inner loop compensator reduces the 39 Hz field by nearly 40 dB, which prevents aliasing in the NMR estimator. These results indicate that when higher frequency fluctuations are present, the inner loop is necessary for anti-aliasing of the MR field estimator.

The two performance metrics were derived from data obtained using the Keck powered magnet operating at 25 T. A two channel High Resolution Magic Angle Spinning (HR-MAS) probe with a pickup coil is mounted from the bottom of the magnet. The probe is sensitive to both hydrogen and deuterium FID signals at 25 T. A correction coil is mounted from the top of the magnet, and the integrating preamplifier and current amplifier are external to the magnet. Passive shims developed by Oxford NMR corrected the field homogeneity from 90 ppm to 10 ppm within a 1 cm volume. The sample installed in the probe contains 90% deuterium and 10% water with copper sulfate and manganese chloride doping. The probe spins the sample at 4 kHz, further reducing linewidth from 10 ppm to 0.05 ppm.

The cascade feedback control system is realized as described above. An independent spectrometer acquires 128 FID signals from the hydrogen nuclei of the sample, which are used to derive the peak frequency and lineshape performance metrics. The FID signals are acquired approximately every 0.6 seconds.

Figure 10:
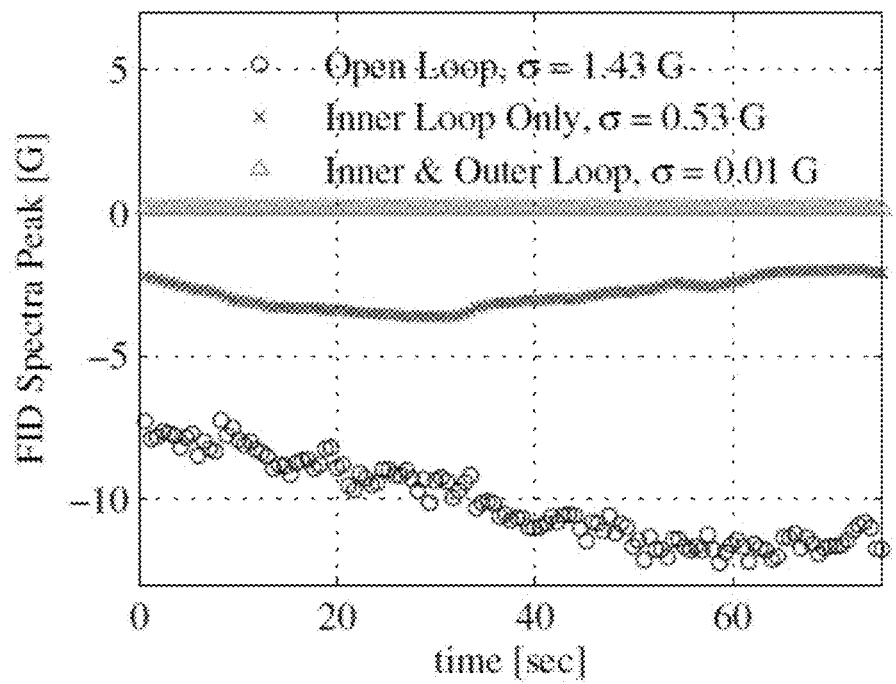
FIG. 10 is a graphical plot of an FID spectra of peak frequencies acquired using a Keck powered magnet operating at 25 T with no compensation, inner loop compensation, and both inner and outer loop compensation.

FIG. 10 shows the FID spectra peak frequencies computed from the FID magnitude spectra. The horizontal axis displays time in seconds, and the vertical axis displays the peak frequency of the FID magnitude spectra in Gauss for each FID. In addition, the legend shows the standard deviation, or rms value, of the peak frequencies for each case of compensation.

When there is no compensation, the peak frequencies change about 5 G (18.8 ppm) with a standard deviation of 1.43 G. Note that 18.8 ppm field change occurs over one minute, which is consistent with the 18.8 ppm/min specification above. With inner loop compensation, the peak frequencies change by more than 1.64 G (6.58 ppm) and the standard deviation is 0.53 G. This moderate reduction in peak frequency change is not surprising because lower frequency fluctuations are still present with inner loop compensation. The best performance is shown when the inner and outer loop compensators are engaged. In this case, the peak frequency shifts by less than 0.05 G (0.188 ppm) with a standard deviation of 0.01 G. These results show that the second control objective is met as the cascade feedback system regulates peak frequencies around a fixed value within 0.05 G.

Figure 11:
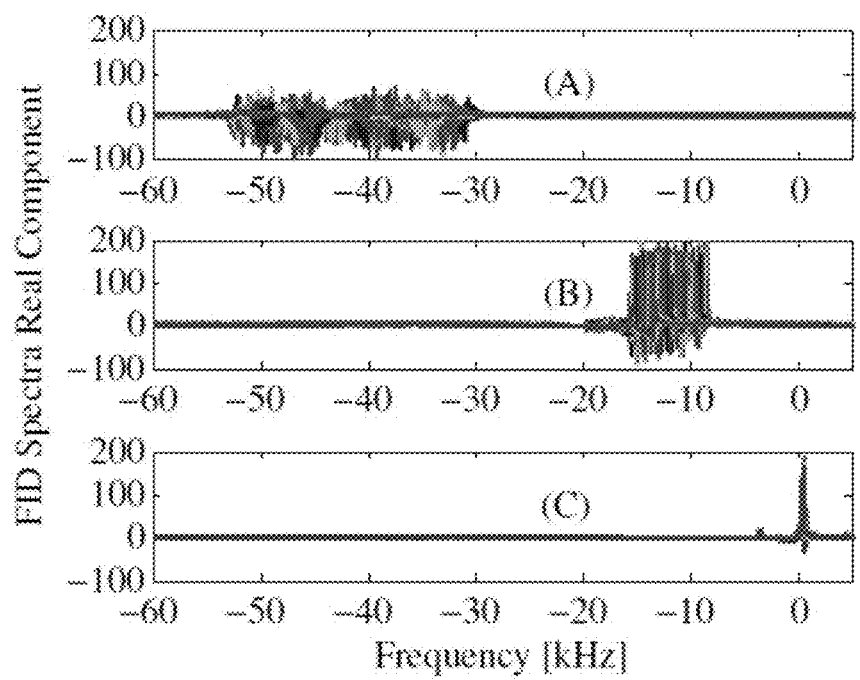
FIG. 11 is a graphical plot of an FID spectra lineshape using a Keck powered magnet operating at 25 T with (A) no compensation, (B) inner loop compensation, and (C) both inner and outer loop compensation.
Figure 12:
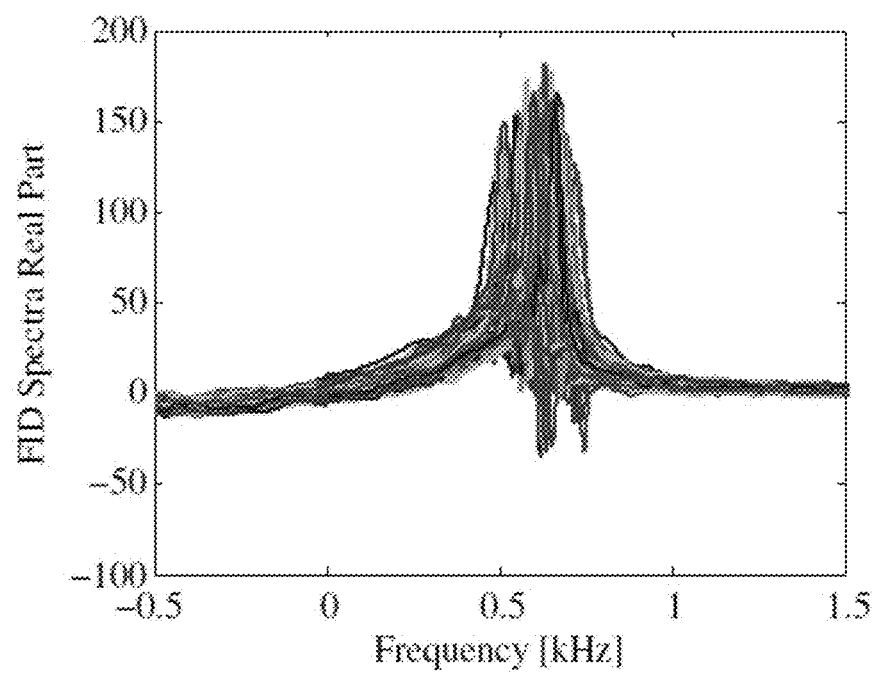
FIG. 12 is a graphical plot of an FID spectra lineshape using a Keck powered magnet operating at 25 T with both inner and outer loop compensation from FIG. 11 (C)

FIG. 11 shows the FID spectra lineshape computed as the real component of the FID spectra. The horizontal axis displays frequency in kHz and the vertical axis displays the FID spectra real component. There are 128 spectra shown in each subplot for the cases of no compensation in the upper subplot (A), inner loop only compensation in the middle subplot (B), and inner and outer loop compensation in the bottom subplot (C). A zoomed in view of subplot (C) is provided in FIG. 12.

When there is no compensation, the lineshape and peak value change between each spectra. With inner loop compensation, the lineshape is much sharper with a peak value more than double that of the no compensation case. However, the peak frequency shifts by more than 7 kHz (6.58 ppm) due to lower frequency fluctuations still present in the magnet. When the inner and outer loop compensators are engaged, the lineshape is still sharp with a slightly smaller peak value than with only inner loop compensation. However, in this case the peak frequency shifts are reduced to approximately 200 Hz (0.188 ppm).

The experimental results described above demonstrate significant reduction in field fluctuations in the Keck powered magnet provided by the cascade feedback control system. These results indicate that the overall objectives and control objectives for the present disclosure have been met. While this is the case, the less than 200 Hz (0.188 ppm) peak frequency shift and improved lineshape may still be inadequate for some NMR spectroscopy experiments. The direct FFLs used for the cascade feedback control system were compared to previous methods. Additionally, the limiting factors and potential improvements for the cascade feedback control system are discussed to further improve NMR spectroscopy.

Several FFLs which directly estimate field fluctuations have been demonstrated for persistent mode magnets, but not for powered magnets. Direct FFL was previously demonstrated in a powered magnet using a LTS coil with inductance 210 H and an external power supply operating at 71.2 A. The inductance is three orders of magnitude larger than the SCH and the operating current is three orders of magnitude smaller than the SCH. Both these factors inherently reduce higher frequency fluctuations, and so aliasing was not an issue using this experimental system. The SCH powered magnet, and any other powered magnet using resistive coils, will have more significant higher frequency fluctuations which must be reduced to avoid aliasing.

In addition to factors limiting the NMR estimator, there are also factors limiting the compensator design. The first compensator limitation is the minimum and maximum correction field that can be provided by the feedback system. These correction fields are defined by the current amplifier and correction coil as well as the digital-to-analog (DAC) converters of the DSP. The maximum correction field is limited by the maximum current the amplifier can source to the correction coil. For the current amplifier and correction coil in this work, the maximum correction field is 7 Gauss. In addition to the maximum correction field, the DSP limits the minimum correction field that can be achieved. The 16 bit DAC of the DSP convert the digital correction signal from the compensators to an analog signal for the amplifier and correction coil, which have a DC gain of 1 Gauss per Volt [G/V]. The minimum quantization voltage of this DAC is $20/2^{16}$ or 0.3 mV, which implies the minimum correction field of the compensators is 0.3 mV×1.0 [G/V], which is 0.3 mG. The maximum correction field could be improved by using a current amplifier that can source larger DC current while the minimum correction field can be improved by using a DAC with better resolution. In a non-limiting embodiment, the system and/or method for reducing temporal fluctuations has a powered magnet that is used for generating a magnetic field and a steady state amplitude of the magnetic field of the powered magnet approaches 0.01 Gauss, +/−0.01 Gauss.

The second compensator limitation is the analysis and design of the cascade feedback control system. For this work, compensators were designed and the performance of the cascade feedback control system was analyzed through computer simulations. It may be more fruitful to consider some more sophisticated analysis techniques for multi-rate multi-loop feedback systems. For example the frequency decomposition or switch decomposition methods may be better tools for analyzing the cascade feedback control system.

A preferred embodiment of the present application uses feedforward compensation to eliminate the effect of field gradients on the estimation of high field frequency fluctuations using inductive measurements. All magnetic resonance imaging (MRI) techniques and certain NMR spectroscopy measurements, such as diffusion, require the presence of switched field gradients. The applied gradient affects operation of both the inner and outer loops of the cascade control system. Prior art based on inductive measurements of higher frequency fluctuations disable the feedback loop during the application field gradients so the correction field does not cancel the desired field gradient. This approach does not compensate for undesirable field fluctuations during the interval when the desired field gradient is active. A preferred embodiment of the present application eliminates the effect of the switch gradients on the inner loop of the flux regulation system by using a feedforward filter to cancel the component of the integrating preamplifier output that is generated by the applied gradient. In addition, the applied magnetic field gradients significantly degrade the measurement SNR of the MR field estimator. Immediately before a gradient is applied, the output of the MR field estimator is latched and held constant for the duration of the applied magnetic field gradient.

Figure 13:
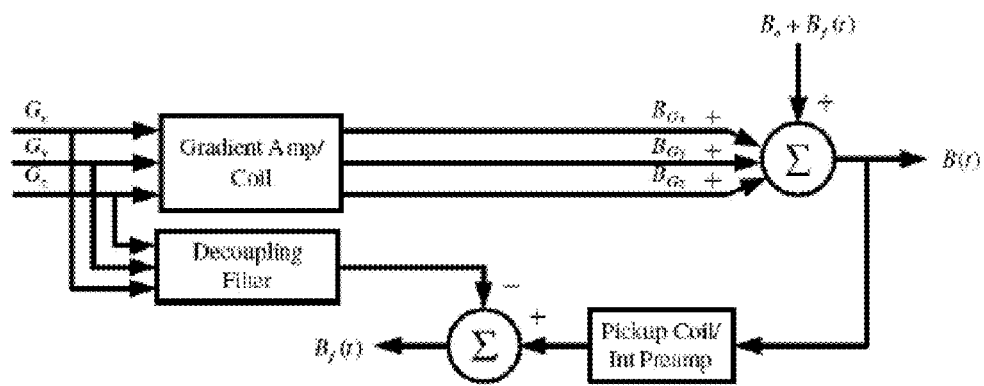
FIG. 13 is a decoupling scheme for inductive feedback control in the presence of field gradients.

It is further necessary to develop a decoupling filter to remove the effect of the pulsed field gradient from the output of the inductive measurement system. A method also must be developed so that a user can auto-tune the decoupling transfer function when using any system, before beginning experiments. This will allow the flux regulation system to be used in multiple powered magnet systems. The present disclosure develops an offline system identification scheme to determine the decoupling filter. FIG. 13 illustrates the decoupling method. The decoupling filter must be identified so the inductive control system does not attempt to compensate for the gradients signals.

The error between the estimated decoupling filter and the measured transfer function from the gradient input to the output of the integrating preamplifier should be reduced to the noise floor of the inductive measurement system. At this point, the inductive measurement system will no longer observe and attempt to attenuate the gradient signal.

To evaluate the feasibility of system identification for decoupling applied magnetic fields, a triangle wave signal was injected into a 7 T superconducting magnet. The input to the current amplifier was recorded, as was the output of the integrating preamplifier. From this, a transfer function was estimated using the MATLAB prediction-error method (PEM) identification technique. The estimated transfer function found in this experiment was $$\hat{G}_{decouple} = \frac{0.11(s-0.018)(s+37.85)}{[s+6.00 \pm j26.39](s+0.28)}, \quad (16)$$

which contains 3 poles and 2 zeros. The transfer function $\hat{G}_{decouple}$ represents a physical system with a different coil injecting the triangle wave disturbance.

Figure 14:
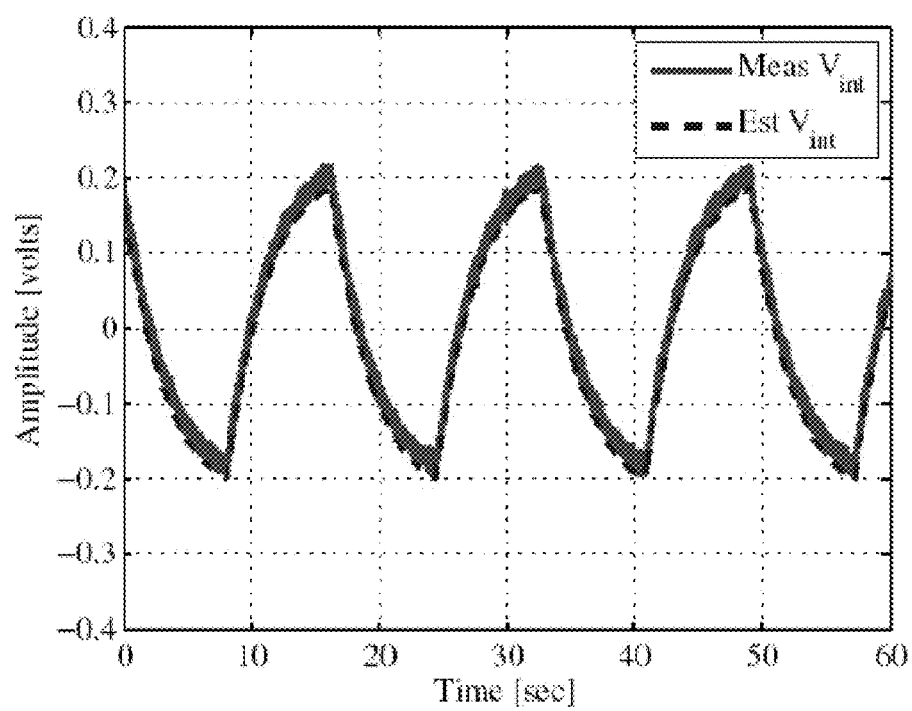
FIG. 14 is a decoupling estimation for applied triangle wave.

FIG. 14 displays the measurement of the applied triangle signal, as well as the estimated decoupling transfer function. This figure shows that it is possible to estimate a filter to decouple an applied signal from the inductive measurement system.

It is expected that the transfer function from the input to the gradient amplifier to the output of the integrating preamplifier is linear time-invariant. Under this assumption, the decoupling filter identification was performed by applying a series of pulses to each channel of the gradient amplifier individually while recording the input to the gradient amplifier and the output of the integrating preamplifier. Then, for each input channel, a decoupling filter was identified.

Before starting MR experiments in a magnet system, a user executes a setup code that applies pulses to each gradient channel and identifies a decoupling filter associated with that channel. Then the user begins the experiments using the flux regulation system, where the identified decoupling filters will automatically be applied to allow the system to run when the gradient signals are applied. Such a setup code can be executed using LabVIEW.

Figure 15:
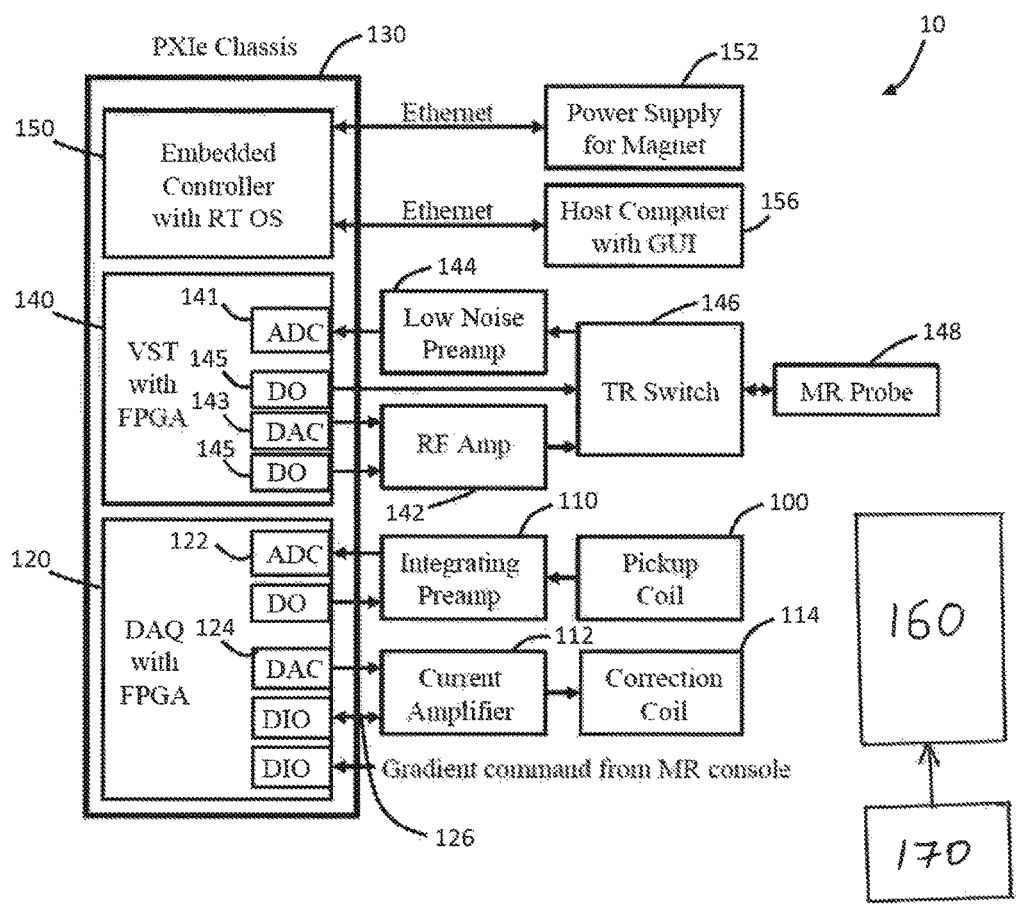
FIG. 15 is a block diagram showing a preferred embodiment of the flux regulator.

FIG. 15 shows a block diagram of a preferred embodiment of a flux regulator system 10. The system includes a magnetic field generator 160 that may be a powered magnet such as a magnetic coil. The magnetic field generator 160 generates a high magnetic field and a fluctuating magnetic field. The magnetic field generator 160 has a power supply with an AC/DC converter 170 that delivers electric current to the magnetic field generator 160. Fast field fluctuations are sensed using a pick up coil 100 placed in proximity to the MR probe 148 used for NMR spectroscopy or MR imaging. As the pickup coil 100 is a Faraday sensor whose output is proportional to the derivative of the temporal field fluctuations, its output is passed to an integrating preamplifier 110. The integrating preamplifier 110 is realized as a low pass filter so that DC offsets in the analog instrumentation will not saturate its output. The integrating preamplifier 110 output is sampled by a data acquisition (DAQ) module 120 with a field programmable gate array (FPGA) mounted in a PXIe chassis 130 using an analog-to-digital converter (ADC) 122 with at least 16-bits of resolution and a conversion time on the order of 1 μs. The phase lead-lag internal model principle (PLL-IMP) compensator is realized using the field programmable gate array (FPGA) that interfaces directly with the ADC 122. Realizing the PLL-IMP compensator on the FPGA fabric minimizes the computational delay and guarantees deterministic operation. The compensator output is converted to analog signal by an analog-to-digital converter (DAC) 124 that has at least 16-bits of resolution and a conversion time on the order of signal by 1 μs. The DAC 124 output drives a current amplifier 112 that drives a current through a correction coil 114. The bandwidth of the current amplifier 112 is chosen at least an order of magnitude larger than the desired bandwidth of the loop transfer function. Digital input-output (DIO) lines 126 connecting the DAQ module 120 and current amplifier allow for notification of thermal shutdowns and enabling the amplifier output.

The DAQ module 120 also realizes the digital filters that decouple the gradient signals used in NMR spectroscopy and MR imaging studies form the preamplifier output signal. The gradient signals generated by the NMR spectrometer and MR imaging console (not shown) are sent digitally to the DAQ module 120.

The DAQ module 120 also realizes the outer loop compensator using the output of the NMR field estimator realized by a vector signal transceiver (VST) 140 with FPGA that is mounted in the same PXIe chassis 130. The output of the NMR field estimator is obtained from the VST using the PXIe bus.

The MR field estimator is realized using the VST 140 mounted in the PXIe chassis 130, a RF power amplifier 142, a low noise preamplifier 144, a transmit-receive (TR) switch 146, and a MR probe 148 containing the nuclei that are used for estimating field fluctuations. The TR switch 146 is used as the single MR probe 148 is used to both excite and receive a MR response. The MR probe 148 is placed in close proximity to the probe used for NMR spectroscopy and MR imaging studies. The VST 140 uses the FPGA, ADC 141, and DAC 143 to generate a train of RF pulses for exciting the MR response and realizing a phase-sensitive receiver that provides the in-phase and quadrature components of the MR response. The bandwidth of the VST receiver and MR probe 148, along with the spectral properties of the excitation sequence, are chosen to guarantee that for the expected range of field fluctuations, an MR response will always be available for estimating the Larmor frequency, and hence static magnetic field seen by the nuclei. Digital output 145 (DO) signals from the VST 140 enable the power amplifier 142 and control the TR switch 146. The algorithm for estimating field fluctuations from the MR response is realized on the FPGA to minimize computational delay and guarantee deterministic operation.

An embedded controller 150 with a real time operating system (RT OS) executes a program that monitors the operation of the flux regulator, controls a power supply 152 that drives the powered magnet used for NMR spectroscopy or MR imaging, and communicates with a host computer 154 that provides a graphical user interface (GUI) for the flux regulator. The embedded controller 150 can communicate with the host computer 154 and magnet power supply using an Ethernet. The GUI on the host computer 154 allows a user to specify a desired static magnetic field, either in units of field intensity or as a Larmor frequency. The host computer GUI also provides information, such as the root-mean-square value of the integrating preamplifier and MR field estimator outputs, that allows the user to assess the performance of the flux regulator.

Patents or publications mentioned in this specification are herein incorporated by reference to the same extent as if each individual publication was specifically and individually indicated to be incorporated by reference.

The disclosure is not restricted to the illustrative examples described herein. Examples described are exemplary, and are not intended to limit the scope of the disclosure. Changes therein, other combinations of elements, and other uses will occur to those skilled in the art based on this description. As such, it is the claims, and all equivalents thereof, that define the scope of the instant disclosure.

We claim:

1. A system for reducing temporal fluctuations in a powered magnet comprising:
    a magnetic field generator that generates a magnetic field with temporal fluctuations;
    a power supply having an AC/DC converter that delivers electric current to the magnetic field generator; and
    a cascade compensator having an inner control loop that outputs an inner loop signal and an outer control loop that outputs an outer loop signal, the inner control loop having a pickup coil and an analog integrating preamplifier and the outer control loop having a magnetic resonance (MR) field estimator, the inner control loop configured to sense fluctuations of the magnetic field over 1 Hz, the outer control loop configured to sense fluctuations of the magnetic field from direct current (DC) to 20 Hz, and the cascade compensator configured to generate a correcting magnetic field that cancels the fluctuations based on the inner loop signal and the outer loop signal.

2. The system of claim 1, wherein the inner control loop is configured as an anti-aliasing filter for the outer control loop.

3. The system of claim 1, wherein the cascade compensator generates the correcting magnetic field based on a least squares algorithm.

4. The system of claim 1, wherein the cascade compensator has an amplifier and a correction coil, the correction coil generating the correcting magnetic field.

5. The system of claim 1, wherein the magnetic field of the powered magnet has a steady state amplitude that approaches 0.01 Gauss, +/−0.01 Gauss.

6. The system of claim 1, wherein the powered magnet is a hybrid magnet having a high-temperature superconductor coil and a low temperature superconductor coil that receive electric current from the power supply.

7. The system of claim 1, wherein the magnetic field generator is a magnetic coil.

8. The system of claim 1, wherein the magnetic field generator is a permanent magnet.

9. The system of claim 1, wherein the cascade compensator has a feed forward compensation configuration and is configured to function in the presence of a plurality of switched magnetic field gradients.

10. The system of claim 1, wherein the cascade compensator maintains a lock mode in the presence of field fluctuations that change rapidly with respect to a dominant time constant of MR signal dynamics governing a lock signal, without the necessity of switching to a sweep mode.

11. A method for reducing temporal fluctuations in a powered magnet comprising:
generating a magnetic field with temporal fluctuations with a magnetic field generator, the magnetic field generator having a power supply with an AC/DC converter that delivers electric current to the magnetic field generator;
providing a cascade compensator having an inner control loop that outputs an inner loop signal and an outer control loop that outputs an outer loop signal, the inner control loop having a pickup coil and an analog integrating preamplifier and the outer control loop having a magnetic resonance (MR) field estimator;
sensing fluctuations over 1 Hz of the magnetic field using the inner control loop;
sensing fluctuations from of the magnetic field from direct current (DC) to 20 Hz using the outer control loop; and
generating a correcting magnetic field that cancels the fluctuations based on the inner loop signal and the outer loop signal with the cascade compensator.

12. The method of claim 11, further comprising maintaining a lock mode in the presence of fluctuations of the magnetic field that change rapidly with respect to a dominant time constant of MR signal dynamics governing a lock signal, without the necessity of switching to a sweep mode.

13. The method of claim 11, wherein the inner control loop is an anti-aliasing filter for the outer control loop.

14. The method of claim 11, further comprising generating the correcting magnetic field based on a least squares algorithm using the cascade compensator.

15. The method system of claim 11, wherein the cascade compensator has an amplifier and a correction coil, the correction coil generating the correcting magnetic field.

16. The method of claim 11, wherein the magnetic field of the powered magnet has a steady state amplitude that approaches 0.01 Gauss, +/−0.01 Gauss.

17. The method of claim 11, further comprising providing the powered magnet, the powered magnet being a hybrid magnet with a high-temperature superconductor coil and a low temperature superconductor coil that receives electric current from the power supply.

18. The method of claim 11, wherein the magnetic field generator is a magnetic coil.

19. The method of claim 11, wherein the magnetic field generator is a permanent magnet.

20. The method of claim 11, wherein the cascade compensator has a feed forward compensation configuration that functions in the presence of a plurality of switched magnetic field gradients.

* * * * *